United States Patent [19]

Winebarger

[11] Patent Number: 5,433,650
[45] Date of Patent: Jul. 18, 1995

[54] METHOD FOR POLISHING A SUBSTRATE

[75] Inventor: Paul Winebarger, Austin, Tex.

[73] Assignee: Motorola, Inc., Schaumburg, Ill.

[21] Appl. No.: 56,274

[22] Filed: May 3, 1993

[51] Int. Cl.⁶ .................... B24B 37/04; B24B 49/12
[52] U.S. Cl. ................................. 451/6; 451/41; 451/287
[58] Field of Search ............. 51/283 R, 131.3, 131.1, 51/165.74, 165.72; 451/41, 287, 285, 8, 6

[56] References Cited

U.S. PATENT DOCUMENTS

| 4,199,902 | 4/1980 | Sauerland | 51/165 R |
|---|---|---|---|
| 4,735,679 | 4/1988 | Lasky | 156/636 |
| 4,956,015 | 9/1989 | Okajima et al. | 106/3 |
| 5,064,683 | 11/1990 | Poon et al. | 427/39 |
| 5,081,796 | 1/1992 | Scholtz | 51/165.74 |
| 5,137,597 | 8/1992 | Curry, II et al. | 156/636 |
| 5,191,738 | 3/1993 | Nakazato et al. | 51/283 R |
| 5,302,233 | 3/1993 | Kim et al. | 156/636 |

Primary Examiner—Robert A. Rose
Attorney, Agent, or Firm—Kent J. Cooper

[57] ABSTRACT

A semiconductor substrate (48) and a block of optical quartz (50) are simultaneously polished. An interferometer (22), in conjunction with a data processing system (16), are then used to monitor the thickness and the polishing rate of the optical quartz block. This allows the endpoint of the polishing process to be automatically and reproducibly detected, and it also allows the polishing rate of the semiconductor substrate (48) to be automatically adjusted during the polishing process.

20 Claims, 2 Drawing Sheets

METHOD FOR POLISHING A SUBSTRATE

FIELD OF THE INVENTION

This invention relates generally to integrated circuits, and more specifically to a polishing process for the formation of semiconductor integrated circuits.

BACKGROUND OF THE INVENTION

Polishing processes, and more specifically chemical-mechanical polishing processes, have been used in the semiconductor industry to prepare both single crystal substrates and silicon on insulator substrates. In addition, chemical-mechanical polishing processes have also been used to planarize various conductive and insulating layers subsequently deposited on these substrates, during the integrated circuit fabrication process. For example, chemical-mechanical polishing has been used to planarize interlevel dielectric layers that lie in between two different levels of metal interconnect. Planarizing the interlevel dielectric layer, prior to the formation of the next level of interconnect, is highly desirable because it allows the next level of interconnect to be subsequently patterned and etched without the formation of conductive metal stringers, which can electrically short adjacent metal lines, and without the formation of thinned or notched metal lines, which can adversely effect device reliability. In addition, chemical-mechanical polishing has also been used to form trench isolation. In this process, trenches are formed and then subsequently filled with a deposited dielectric layer, such as silicon dioxide. The dielectric layer is then polished back to form dielectric filled isolation trenches, which are nearly planar with the adjacent active regions. In addition to being planar, the resulting trench isolation is also desirable because it allows the space separating adjacent active regions to be minimized, and thus allows integrated circuits with high device packing densities to be fabricated.

Unfortunately, it is difficult to accurately and reproducibly polish semiconductor substrates, and the materials subsequently deposited on them. One of the main reasons for this difficulty is that accurate endpoint determination, or detecting when a given polishing process should be stopped, is difficult to achieve. As a result, the materials being polished may be either under-polished or over-polished. Both of these results may adversely effect the functionality of an integrated circuit. For example, if the interlevel dielectric layer lying between the two levels of metal interconnect is over-polished, then its thickness may be insufficient to prevent the two levels of interconnect from being electrically shorted to one another. On the other hand, if the interlayer dielectric layer is under-polished, then its increased thickness may result in the formation of electrically open vias. Similarly, inaccurate endpoint detection may also adversely effect the trench isolation process, as well as other processes where a selected thickness of material is to be reproducibly removed by a polishing process. Moreover, operating conditions that effect the polishing rate, such as the roughness of the polishing surface, may also change during the polishing process. Therefore, the inability to accurately endpoint a given polishing process may be further compounded by polishing rates that vary with time. Accordingly, a need exists for a polishing process that can accurately and reproducibly remove a selected thickness of material.

SUMMARY OF THE INVENTION

The previously mentioned problems with existing polishing processes are overcome by the present invention. In one embodiment of the invention, a substrate, a means for polishing, and a disposable polishing material, which is physically separated from the substrate, are provided. The means for polishing has a polishing surface and the substrate and the disposable polishing material are placed in contact with this surface. The substrate and the disposable polishing material are then polished and the thickness of the disposable polishing material is monitored. After a selected thickness of the disposable polishing material has been removed the polishing step is terminated.

In another embodiment of the invention, a substrate, a means for polishing, and a disposable polishing material, which is physically separated from the substrate, are provided. The means for polishing has a polishing surface and the substrate and the disposable polishing material are placed in contact with this surface. The substrate contacts the polishing surface with a selected force. The substrate and the disposable polishing material are then polished and the polishing rate of the disposable polishing material is monitored, and the polishing rate of the substrate is adjusted.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
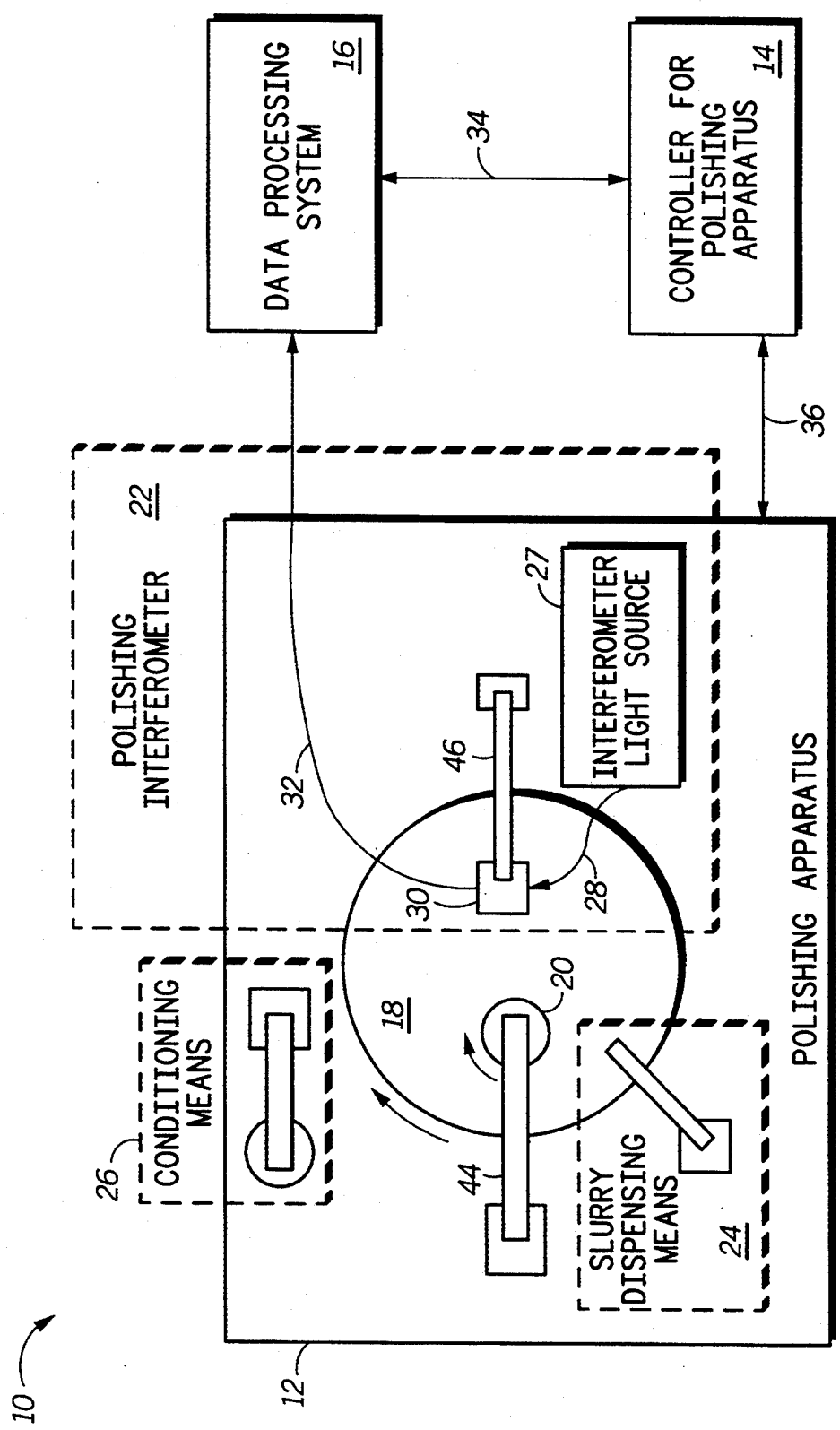
FIG. 1 illustrates, in plan view, a polishing system in accordance with one embodiment of the invention.

FIG. 1 illustrates in plan view a polishing system 10 in accordance with one embodiment of the invention. Polishing system 10 comprises a polishing apparatus 12, a controller 14 for polishing apparatus 12, and a data processing system 16. In one embodiment, as shown in FIG. 1, polishing apparatus 12 comprises a rotatable polishing surface 18, a rotatable substrate carrier 20, a polishing interferometer 22, a slurry dispensing means 24, and a conditioning means 26 for rotatable polishing surface 18. Additionally, in this embodiment of the invention polishing interferometer 22 comprises an interferometer light source 27, a light pipe 28, an interferometric carrier 30, and a signal bus 32. As shown in FIG. 1, signal bus 32 is coupled to data processing system 16, which is in turn bidirectionally coupled to controller 14 by a first information bus 34. In addition, controller 14 is bidirectionally coupled to polishing apparatus 12 by a second information bus 36. Data processing system 16 may be a single chip microcontroller, or a board level microcontroller, or a computer. In this embodiment of the invention interferometer light source 27 is preferably a laser and light pipe 28 is preferably a fiber optic cable.

Figure 2:
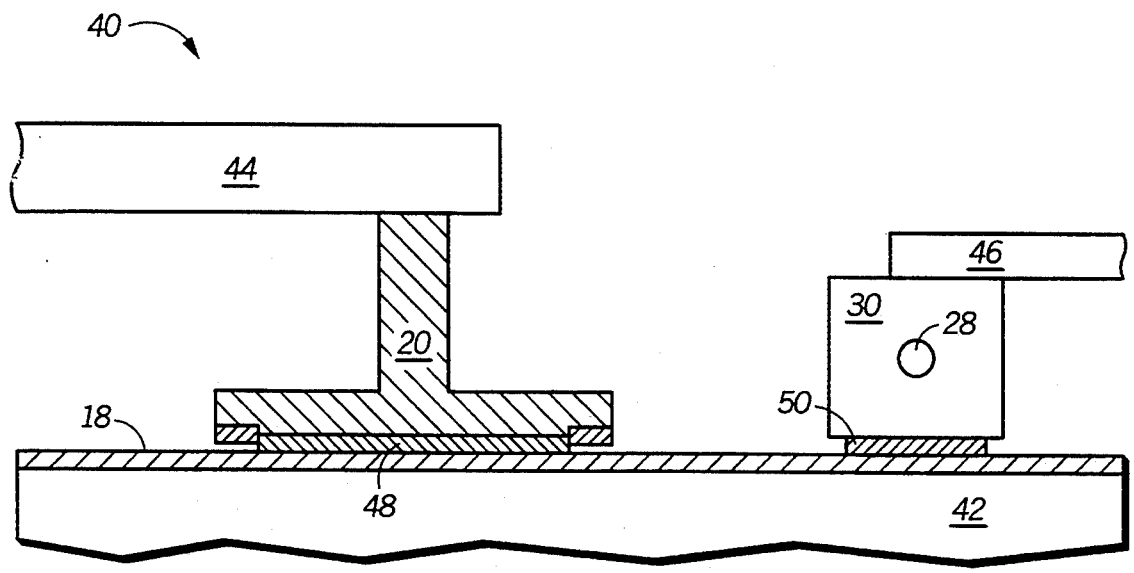
FIG. 2 illustrates, in cross-section, process steps in accordance with one embodiment of the invention.

Shown in FIG. 2, are process steps in accordance with one embodiment of the invention wherein a substrate is polished. FIG. 2 is a side view of a portion 40 of polishing apparatus 12 showing a rotatable platen 42, rotatable polishing surface 18, rotatable substrate carrier 20, interferometric carrier 30, light pipe 28, polishing arm 44, and holding arm 46. As shown in FIG. 2, a substrate 48 is provided and mounted onto rotatable substrate carrier 20, such that the surface which is going to be polished faces out from rotatable substrate carrier 20. Similarly, a disposable polishing material 50 is provided and mounted onto the bottom of interferometric carrier 30. Substrate 48 and disposable polishing material 50 are then placed in contact with rotatable polishing surface 18, as shown in FIG. 2. Holding arm 46 is used to position the interferometric carrier over rotatable polishing surface 18, and to exert a downward force such that disposable polishing material 50 contacts rotatable polishing surface 18 with a selected contact force. Similarly, polishing arm 44 is used to position rotatable substrate carrier 20 over rotatable polishing surface 18, and to exert a downward force such that substrate 48 contacts rotatable polishing surface 18 with a selected contact force. Rotatable polishing surface 18 and substrate 48 are then rotated such that substrate 48 and disposable polishing material 50 are polished. In addition, for chemical-mechanical polishing applications a slurry is dispensed onto rotatable polishing surface 18 using slurry dispensing means 24. The thickness of disposable polishing material 50 is then monitored during the polishing step by polishing interferometer 22.

For endpoint applications, the thickness of disposable polishing material 50 is monitored using interferometer 22 and status information is input into data processing system 16. After data processing system 16 calculates that a selected thickness of disposable polishing material 50 has been removed, an informational input is sent to controller 14. Based on this input, controller 14 sends a command to polishing apparatus 12 causing the polishing step to be automatically terminated. For example, a chemical-mechanical polishing process, used to planarize a silicon dioxide interlevel dielectric layer deposited on a semiconductor substrate, may be endpointed using the following technique. The semiconductor substrate is mounted onto rotatable substrate carrier 20, as discussed above. Similarly, disposable polishing material 50 is mounted to interferometric carrier 30. The semiconductor substrate and disposable polishing material 50 are then placed in contact with rotatable polishing surface 18. The semiconductor substrate and rotatable polishing surface 18 are rotated, and a slurry comprising colloidal silica and a potassium hydroxide solution, with a pH of approximately 10, is dispensed onto rotatable polishing surface 18. The thickness of disposable polishing material 50 is then monitored using interferometer 22. If the silicon dioxide interlevel dielectric layer and disposable polishing material 50 have approximately the same polishing rate, then the polishing process is automatically terminated when data processing system 16 determines that the predetermined thickness of silicon dioxide required to be removed from the semiconductor substrate has been removed from disposable polishing material 50. For example, if 7000 angstroms of silicon dioxide needs to be removed from the semiconductor substrate, then the polishing cycle is terminated after the thickness of disposable polishing material 50 has been reduced by 7000 angstroms. The substrate and the disposable polishing material, however, need not have the same polishing rate, and thus equivalent amounts of material need not be removed from both the substrate and disposable polishing material 50 in order for endpoint to be determined, as will be discussed later.

Additionally, the polishing rate of substrate 48 may also be automatically adjusted by monitoring the polishing rate of disposable polishing material 50. For example, status information from interferometer 22 is input into data processing system 16. Data processing system 16 calculates a polishing rate for disposable polishing material 50 and inputs information into controller 14. Based on this input, controller 14 sends a command to polishing apparatus 12 to make an operational change that will effect the polishing rate of substrate 48. For example, controller 14 may instruct polishing apparatus 12 to adjust a rotational speed, such as the rotational speed of substrate 48 or the rotational speed of polishing surface 18. Similarly, controller 14 may instruct polishing apparatus 12 to adjust the contact force between substrate 48 and rotatable polishing surface 18. In addition, for chemical-mechanical polishing applications this feed back loop may also be used to control the frequency at which slurry is dispensed onto rotatable polishing surface 18 or the quantity of slurry that is dispensed. Additionally, this feed back loop may also be used to determine when rotatable polishing surface 18 should be replaced or when rotatable polishing surface 18 should be conditioned by conditioning means 26. Once again, substrate 48 and disposable polishing material 50 are not required to have the same polishing rate. A correlation between the polishing rate of disposable polishing material 50 and the polishing rate of substrate 48 may be used to make adjustments to the polishing rate of substrate 48, as will be discussed later.

Figure 3:
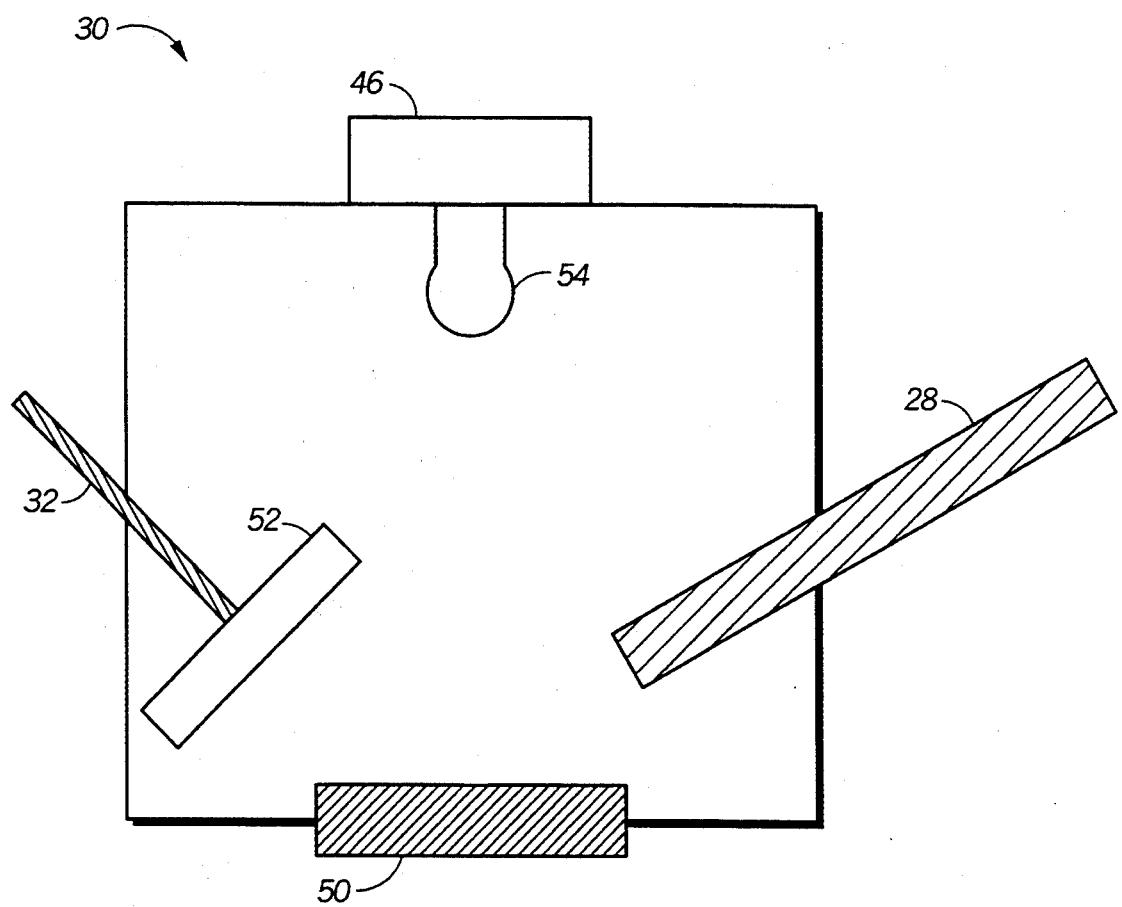
FIG. 3 illustrates, in cross-section, an interferometric carrier in accordance with one embodiment of the invention.

Shown in FIG. 3, is an enlarged cross-section of an interferometric carrier 30 in accordance with one embodiment of the invention, wherein disposable polishing material 50 has been mounted to interferometric carrier 30. Light pipe 28 extends through the sidewall of interferometric carrier 30 at an oblique angle with respect to mounted disposable polishing material 50. An optical detector 52 is attached to the sidewall opposite light pipe 24, and is also positioned at an oblique angle with respect to mounted disposable polishing material 50. The optical detector is also coupled to one end of signal bus 32. Interferometric carrier 30 is preferably mounted to holding arm 46 using a gimbaling mechanism 54. Disposable polishing material 50 is mounted to the bottom surface of interferometric carrier 30, such that its thickness, and its polishing rate can be monitored using well-known interferometric techniques. In a preferred embodiment disposable polishing material 50 is preferably optical quartz. Alternatively, disposable polishing material 50 may be another transmissive material, such as silicon nitride. Additionally, it is important to note that the material or materials being polished in rotatable substrate carrier 20 need not be identical to disposable polishing material 50. More specifically, the material or materials being polished in rotatable substrate carrier 20 need not have the same polishing rate as disposable polishing material 50. The polishing rate of disposable polishing material 50 need only be correlated with the material being polished in rotatable substrate carrier 20, in order for the polishing cycle to be endpointed, or for the material's polishing rate to be monitored and adjusted. For example, tungsten deposited on a semiconductor substrate may be polished back to form planar tungsten filled contact or via plugs using quartz as a disposable polishing material. In this particular application, endpoint detection and adjustments to the tungsten polishing rate would be made using a correlation between the tungsten polishing rate and the quartz polishing rate.

The foregoing description and illustrations contained herein demonstrate many of the advantages associated with the present invention. In particular, interferometrically monitoring the thickness of a material, which is polished simultaneously with a substrate, but which is physical separated from the substrate, allows a given polishing process to be accurately and reproducibly endpointed. Moreover, the interferometric monitoring process may also be used to monitor and adjust the polishing rate of the substrate during the polishing cycle. Therefore, variations in a substrate's polishing rate that can adversely effect the accuracy and reproducibility of the polishing cycle's endpoint can be minimized. Therefore, the present invention allows a selected thickness of material to be accurately and reproducibly removed by a polishing process, and thus allows semiconductor integrated circuits to be reliably fabricated.

Thus it is apparent that there has been provided, in accordance with the invention, a method for polishing a substrate that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, although a laser interferometer was specifically mentioned, it is envisioned that other interferometers or measuring devices may be used to monitor disposable polishing material 50. In addition, although polish planarization processes for interlevel dielectric layers and tungsten plugs were specifically described, it is not intended that the invention be limited to these specific applications. For example, the invention may also be used to form silicon on insulator (SOI) substrates, single crystal substrates, trench isolation, and other planarized electrical interconnects, et cetera. It is also important to note that the present invention is not limited in any way to a specific polishing means. Other polishing means having a configuration that is different from that of polishing apparatus 12 may also be used. For example, it is envisioned that a polishing apparatus having a non-rotatable polishing surface could also be used. Furthermore, the term disposable does not imply that disposable polishing material 50 must be replaced each time a substrate is polished. The same piece of disposable polishing material may in fact be used to polish several substrates. Moreover, in some applications it is envisioned that endpoint and polishing rate adjustments may also be made manually based on the information provided by data processing system 16. Additionally, it is also envisioned that more than one interferometric monitoring system could be used to monitor and control the polishing uniformity across the polishing surface. Therefore, it is intended that this invention encompass all such variations and modifications as fall within the scope of the appended claims.

I claim:

1. A method for polishing a substrate comprising the steps of:
   providing the substrate;
   providing a means for polishing, said means for polishing having a polishing surface, a first carrier, and a second carrier, the second carrier having a disposable polishing material mounted thereon;
   mounting the substrate to the first carrier;
   placing the substrate, which is mounted to the first carrier, and the disposable polishing material, which is mounted to the second carrier, in contact with the polishing surface;
   polishing the substrate and the disposable polishing material;
   monitoring the thickness of the disposable polishing material with an interferometer, while the first carrier remains directly over the polishing surface; and
   terminating the polishing step after a selected thickness of the disposable polishing material has been removed.

2. The method of claim 1 wherein the step of providing the means for polishing, the disposable polishing material is further characterized as a transmissive material.

3. The method of claim 2 wherein the step of providing the means for polishing, the transmissive material is further characterized as optical quartz.

4. The method of claim 1 wherein the step of monitoring the thickness of the disposable material comprises:
   monitoring the thickness of the disposable polishing material using a laser interferometer.

5. The method of claim 1 wherein the step of providing the substrate comprises:
   providing a semiconductor substrate.

6. The method of claim 1 wherein the step of polishing the substrate comprises:
   polishing a semiconductor substrate to form a planarized interlevel dielectric layer.

7. The method of claim 1 wherein the step of polishing the substrate comprises:
   polishing a semiconductor substrate to form trench isolation.

8. A method for polishing a substrate, the substrate having a polishing rate, the method comprising the steps of:
   providing the substrate;
   providing a means for polishing, said means for polishing having a polishing surface, a first carrier, and a second carrier, the second carrier having a disposable polishing material mounted thereon;
   mounting the substrate to the first carrier;
   placing the substrate, which is mounted to the first carrier, and the disposable polishing material, which is mounted to the second carrier, in contact with the polishing surface, the substrate contacting the polishing surface with a selected force;
   polishing said substrate and the disposable polishing material,
   monitoring the polishing rate of the disposable polishing material with an interferometer, while the first carrier remains directly over the polishing surface; and
   adjusting the polishing rate of the substrate.

9. The method of claim 8 wherein the step of providing the means for polishing, the disposable polishing material is further characterized as a transmissive material.

10. The method of claim 9 wherein the step of providing the means for polishing, the transmissive material is further characterized as optical quartz.

11. The method of claim 8 wherein the step of monitoring the polishing rate of the disposable polishing material comprises:

monitoring the polishing rate of the disposable polishing material using a laser interferometer.

12. The method of claim 8 wherein the step of providing the substrate comprises:

providing a semiconductor substrate.

13. The method of claim 8 wherein the step of adjusting the polishing rate of the substrate comprises:

adjusting the polishing rate of the substrate by a means selected from the group consisting of: conditioning the polishing surface, dispensing a slurry on the polishing surface, adjusting a rotational speed, and adjusting the selected force.

14. The method of claim 8 wherein the step of polishing the substrate comprises:

polishing a semiconductor substrate to form a planarized interlevel dielectric layer.

15. The method of claim 8 wherein the step of polishing the substrate comprises:

polishing a semiconductor substrate to form trench isolation.

16. A method for polishing a semiconductor substrate comprising the steps of:

providing the semiconductor substrate;

providing a means for polishing, said means for polishing having a polishing surface, a first carrier, and a second carrier, the second carrier having disposable polishing material mounted thereon;

mounting the semiconductor substrate to the first carrier;

placing the semiconductor substrate, which is mounted on the first carrier, and the disposable polishing material which is mounted on the second carrier, in contact with the polishing surface;

polishing said semiconductor substrate and the disposable polishing material;

monitoring the thickness of the disposable polishing material with an interferometer, while the first carrier remains directly over the polishing surface; and terminating the polishing step after a selected thickness of the disposable polishing material has been removed.

17. The method of claim 16 wherein the step of polishing the semiconductor substrate comprises:

polishing the semiconductor substrate to form a planarized interlevel dielectric layer.

18. The method of claim 16 wherein the step of polishing the semiconductor substrate comprises:

polishing the semiconductor substrate to form trench isolation.

19. The method of claim 16 wherein the step of polishing the semiconductor substrate comprises:

polishing the semiconductor substrate to form a silicon on insulator substrate.

20. The method of claim 16 wherein the step of polishing the semiconductor substrate comprises:

polishing the semiconductor substrate to form a planarized electrical interconnect.

* * * * *